United States Patent
Ge et al.

(10) Patent No.: US 9,484,289 B2
(45) Date of Patent: Nov. 1, 2016

(54) SEMICONDUCTOR DEVICE WITH HEAT SPREADER

(71) Applicants: You Ge, Tianjin (CN); Meng Kong Lye, Shah Alam (MY); Penglin Mei, Tianjin (CN)

(72) Inventors: You Ge, Tianjin (CN); Meng Kong Lye, Shah Alam (MY); Penglin Mei, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 24 days.

(21) Appl. No.: 14/462,567

(22) Filed: Aug. 19, 2014

(65) Prior Publication Data
US 2015/0108625 A1    Apr. 23, 2015

(30) Foreign Application Priority Data
Oct. 18, 2013    (CN) .......................... 2013 1 0489288

(51) Int. Cl.
| H01L 23/10 | (2006.01) |
| H01L 23/495 | (2006.01) |
| H01L 23/36 | (2006.01) |
| H01L 23/433 | (2006.01) |

(52) U.S. Cl.
CPC ......... *H01L 23/49568* (2013.01); *H01L 23/36* (2013.01); *H01L 23/4334* (2013.01); *H01L 2224/48091* (2013.01); *H01L 2224/48247* (2013.01); *H01L 2224/73265* (2013.01)

(58) Field of Classification Search
CPC ............... H01L 23/34; H01L 23/3677; H01L 23/49568; H01L 23/36; H01L 23/4334; H01L 23/3675

USPC .......................................... 257/666, 676, 707
See application file for complete search history.

(56) References Cited

U.S. PATENT DOCUMENTS

| | | | |
|---|---|---|---|
| 3,930,114 A | 12/1975 | Hodge | |
| 5,041,902 A | 8/1991 | McShane | |
| 5,072,283 A | 12/1991 | Bolger | |
| 5,559,306 A * | 9/1996 | Mahulikar | H01L 23/16 174/521 |
| 5,629,561 A * | 5/1997 | Shin | H01L 23/4334 257/675 |
| 5,679,975 A | 10/1997 | Wyland et al. | |
| 5,723,899 A | 3/1998 | Shin | |
| 6,222,258 B1 * | 4/2001 | Asano | H01L 23/4334 257/675 |
| 6,265,771 B1 * | 7/2001 | Ference | H01L 23/3677 257/676 |
| 6,329,705 B1 * | 12/2001 | Ahmad | H01L 23/16 257/666 |
| 6,369,455 B1 * | 4/2002 | Ho | H01L 23/3128 257/730 |
| 6,469,380 B2 * | 10/2002 | Sorimachi | H01L 23/4334 257/706 |
| 6,918,178 B2 | 7/2005 | Chao | |
| 7,009,283 B1 | 3/2006 | de Simone | |

(Continued)

OTHER PUBLICATIONS

Notice of Allowance dated Oct. 15, 2014 in U.S. Appl. No. 14/077205.

*Primary Examiner* — Nitin Parekh (57) ABSTRACT

A semiconductor device includes a package body, a semiconductor die embedded in the package body and a heat spreader attached to a top surface of the package body and spaced from semiconductor die. The heat spreader may be formed of solder that is melted within a recess in the top surface of the package body.

12 Claims, 6 Drawing Sheets

(56) References Cited

U.S. PATENT DOCUMENTS

| | | | |
|---|---|---|---|
| 7,479,692 B2 * | 1/2009 | Dimaano, Jr. | H01L 23/4334 257/675 |
| 7,545,032 B2 * | 6/2009 | Bathan | H01L 21/565 257/690 |
| 7,598,903 B2 * | 10/2009 | Yang | G01S 13/36 342/118 |
| 7,902,644 B2 | 3/2011 | Huang et al. | |
| 8,211,753 B2 * | 7/2012 | Ramakrishna | H01L 21/4878 257/E23.051 |
| 8,901,722 B2 | 12/2014 | Ge et al. | |
| 2003/0160313 A1 | 8/2003 | Ichihashi et al. | |
| 2007/0090502 A1 * | 4/2007 | Zhao | H01L 23/3128 257/675 |
| 2007/0132091 A1 * | 6/2007 | Wu | H01L 21/4828 257/706 |
| 2007/0284733 A1 * | 12/2007 | Leung | H01L 23/13 257/712 |
| 2009/0146269 A1 * | 6/2009 | Chow | H01L 23/3107 257/659 |
| 2014/0103505 A1 * | 4/2014 | Zhao | H01L 23/4334 257/675 |

* cited by examiner

FIG.1

(PRIOR ART)

FIG.2

(PRIOR ART)

SEMICONDUCTOR DEVICE WITH HEAT SPREADER

BACKGROUND OF THE INVENTION

The present invention is directed to a semiconductor device and, more particularly to a semiconductor device with a heat spreader.

Figure 1:
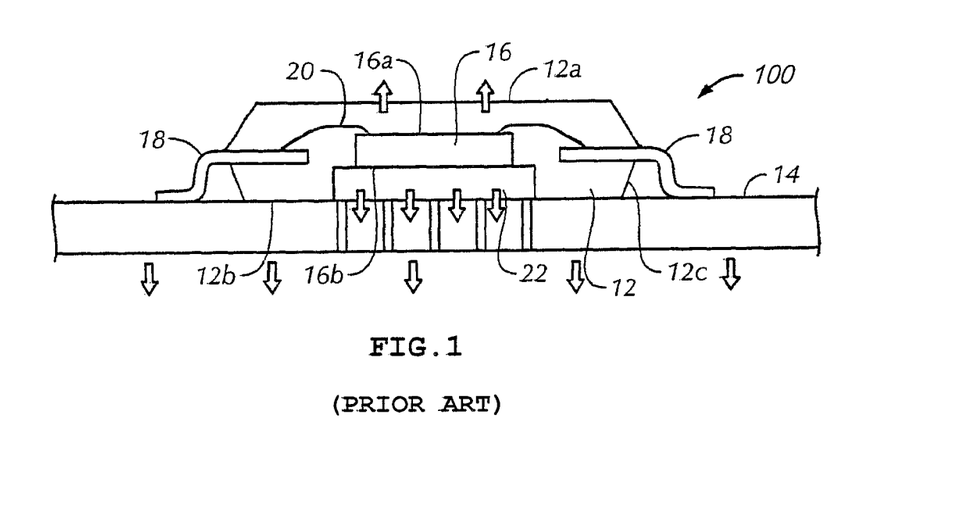
FIG. 1 is a cross-sectional side elevational view of a conventional semiconductor device.
Figure 2:
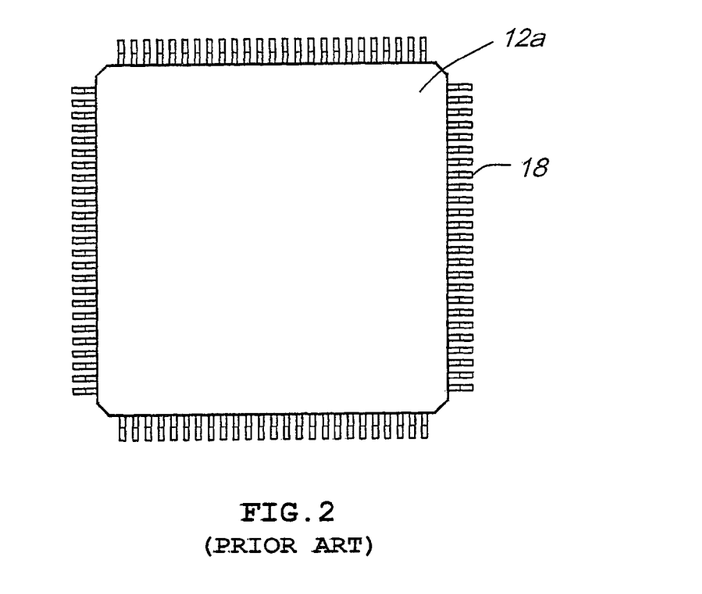
FIG. 2 is a top plan view of the semiconductor device in FIG. 1.

In current packaged semiconductor devices, thermal dissipation paths for heat generated by the encapsulated semiconductor die are limited. FIGS. 1 and 2 show a conventional semiconductor device 100, which includes a package body 12 having a top surface 12*a*, an opposing bottom surface 12*b* and side surfaces 12*c*, and is mounted to a printed circuit board (PCB) 14. A semiconductor die 16 has a top, active main surface 16*a* and an opposing bottom surface 16*b*, and is embedded within the package body 12. Leads 18 extend from the side surfaces 12*c* of the package body 12. The die 16 is coupled to the leads 18 with wires 20. The leads 18 allow the device 100 to be connected to the PCB 14. Heat generated by the die 16 is conducted through the package body 12 to the top surface 12*a* of the package body 12, where it is then dissipated to the environment (shown by the upward arrows). In addition, heat may also be conducted, for example via an exposed flag or pad 22, upon which the die 16 is attached, to the PCB 14. The heat is then conducted through the PCB 14 and thereafter is dissipated to the environment (shown by the downward arrows).

Such heat conduction and dissipation paths may not be sufficient to adequately cool the semiconductor die, which can lead to overheating and damage to the semiconductor device, especially if the device is a high power device. At the same time, smaller sizes and profiles for semiconductor packages, such as Quad Flat Packages (QFP) and Small Outline Integrated Circuits (SOIC), are constantly being sought as electronic devices incorporating such semiconductor packages continue to shrink, thereby shrinking the available area for heat dissipation.

A common solution has been to add a separate heat sink to the top surface of the semiconductor device to improve its thermal performance. This requires additional materials and attachment steps, can increase the production time and cost, and can also result in the size of the finished package being larger than desired.

It is therefore desirable to provide a semiconductor device that allows for improved cooling of the semiconductor die, but that does not greatly increase the size of the finished device.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

According to an embodiment of the present invention, there is provided a semiconductor device including a package body having a top surface and an opposing bottom, mounting surface. A semiconductor die is embedded within the package body and has a top, active surface facing the package body top surface and an opposing bottom surface facing the package body bottom surface. A heat spreader is attached to the top surface of the package body, but is spaced from the active surface of the die. The heat spreader aids in conducting heat generated by the die to the outside of the package body.

According to another embodiment of the present invention, there is provided a semiconductor device comprising: a package body having a top surface and an opposing bottom surface. A semiconductor die is embedded in the package and has an active surface facing the top surface of the package body and an opposing, bottom surface facing the bottom surface of the package body. At least one tie bar is partially embedded within the package body and has an exposed segment that extends outside of the package. A portion of the exposed segment is received within a groove in the top surface of the package body and is in contact with the top surface of the package body. A heat spreader is in contact with the top surface of the package body and the portion of the exposed segment.

According to still another embodiment of the present invention, there is provided a method of assembling a semiconductor device including embedding a semiconductor die in a packaging material to form a package body. The package body has a top surface and an opposing bottom mounting surface. The semiconductor die has a top active surface facing the top surface of the package body and an opposing bottom surface facing the bottom surface of the package body. The method includes attaching a heat spreader on the top surface of the package, preferably within a recess on the top surface of the package body. The heat spreader, even though spaced from the active surface of the die, conducts heat generated by the die away from the package body.

Figure 3:
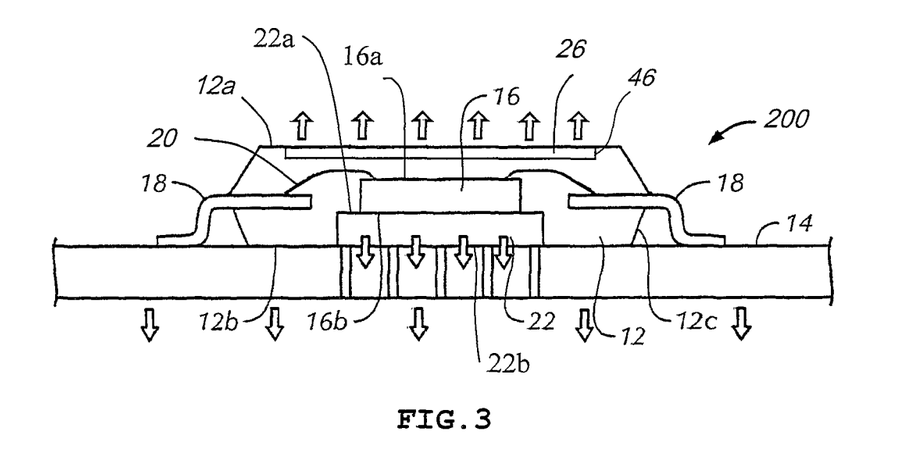
FIG. 3 is a cross-sectional side elevational view of a semiconductor device in accordance with an embodiment of the present invention.

Referring now to FIG. 3, a semiconductor device 200 in accordance with an embodiment of the invention is mounted on a PCB 14. The semiconductor device 200 includes a package body 12 having a top surface 12*a* and an opposing, bottom surface 12*b*. The bottom surface 12*b* of the package body 12 is, for example, mounted proximate to or in contact with the PCB 14. A side surface 12*c* connects the top surface 12*a* and the bottom surface 12*b*, and may extend perpendicularly to one or both of the top main surface 12*a* and the bottom surface 12*b*. The package body 12 may be constructed from a mold compound, such as a ceramic material, a polymeric material, or the like. As will be understood from the following description, the present invention is applicable to all types of packages.

A semiconductor die 16 is encapsulated in the package body 12. The semiconductor die 16 is typically in the form of an integrated circuit (IC) or the like. The semiconductor die 16 may be made from any semiconductor material or combinations of materials, such as gallium arsenide, silicon germanium, silicon-on-insulator (SOI), silicon, monocrystalline silicon, the like, and combinations of the above. It is preferred that the semiconductor die 16 includes an active surface 16*a* facing the top surface 12*a* of the package body 12, and an opposing bottom surface 16*b* facing the bottom surface 12*b* of the package body 12.

In a preferred embodiment of the invention, the semiconductor die 16 is electrically coupled to a plurality of leads 18 surrounding the semiconductor die 16 with a plurality of bonding wires 20 through a wire bonding process. The semiconductor die 16, the plurality of bonding wires 20, and part of each of the plurality of leads 18 are encapsulated in the package body 12. The material, number, shape and arrangement of the plurality of leads 18 may be varied as necessary depending on the type of the semiconductor die 16, the configuration of the PCB 14, the shape of the package body 12, and other like factors. However, direct connections of the plurality of leads 18 to the semiconductor die 16 are also contemplated.

In a preferred embodiment, the semiconductor device 200 further includes a die flag 22 surrounded by the plurality of leads 18, having a top surface 22*a* and a bottom surface 22*b*, wherein the bottom surface 16*b* of the semiconductor die 16 is attached to the top surface 22*a* of the die flag 22, and the bottom surface 22*b* of the die flag 22 is exposed at the bottom surface 12*b* of the package body 12. The material of the die flag 22 is not particularly limited. The semiconductor die 16 is preferably attached to the die flag 22 with an adhesive, such as an epoxy material, though it is not necessarily limited thereto.

The semiconductor device 200 further includes a heat spreader or thermally conductive member 26 disposed in contact with the top surface 12*a* of the package body 12 and spaced from the active surface 16*a* of the semiconductor die 16 by a portion of the package body 12, wherein the thermally conductive member 26 conducts heat generated by the semiconductor die 16. More specifically, as shown schematically by the upward arrows in FIG. 3, in the semiconductor device 200, more heat is conducted through the package body 12 to the top main surface 12*a* of the package body 12 and then dissipated to the environment due to the thermally conductive member 26. Therefore, the thermally conductive member 26 provides an integral heat sink, increasing the thermal dissipation efficiency of the semiconductor device 200, especially for the top surface 12*a* of the package body 12.

In a preferred embodiment, the thermally conductive member 26 is disposed within a recess 46 in the top surface 12*a* of the package body 12 (in such a case, the thermally conductive member 26 can still be regarded as being in contact with the top surface 12*a* of the package body 12). In a preferred embodiment as shown in FIG. 3, the recess 46 has a depth that generally corresponds to the thickness of the thermally conductive member 26 and is provided in the top surface 12*a* of the package body 12 to accommodate the thermally conductive member 26. In this manner, the semiconductor device 200 can have a flat profile. Alternatively, the depth of the recess 46 may be larger or smaller than the thickness of the thermally conductive member 26 depending on the thickness of the package body 12 or the like, and in such cases, the top surface of the thermally conductive member 26 may be lower or higher than the top surface 12*a* of the package body 12. However, the recess 46 is not necessarily provided, and the thermally conductive member 26 is disposed on the top surface 12*a* of the package body 12 directly. In each of the above cases, the thermally conductive member 26 serves as an integral heat sink, increasing the thermal dissipation efficiency of the semiconductor device 200, especially at the top surface 12*a* of the package body 12.

The thermally conductive member 26 is preferably made from a material with good heat conductance. For example, the thermally conductive member 26 may comprise a metal member and may be made from metals such as copper (Cu) and aluminium (Al), alloys thereof, or any combination thereof. However, it is not necessarily limited thereto. As long as the thermally conductive member 26 has good heat conductance, the thermal dissipation efficiency of the semiconductor device 200 can be increased.

In a preferred embodiment, the thermally conductive member 26 comprises a metal slug. The metal slug is typically in the form of a single layer. However, a multilayer metal slug may also be used.

Figure 4:
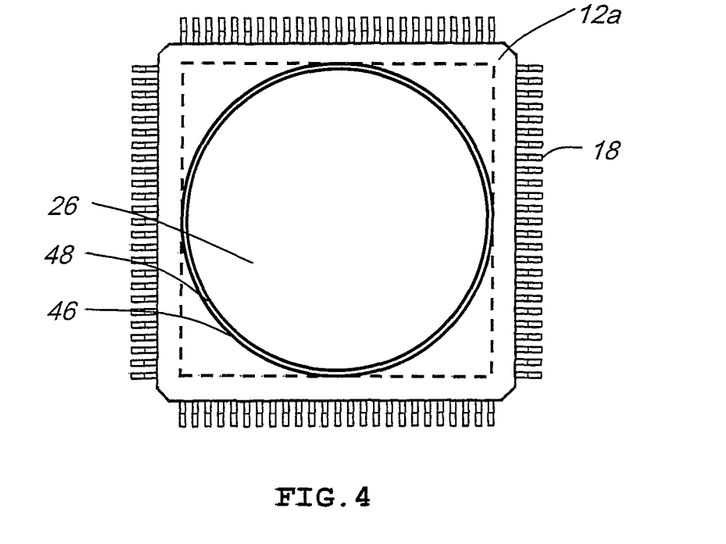
FIG. 4 is a top plan view of the semiconductor device of FIG. 3.

FIG. 4 shows a top plan view of the semiconductor device 200. In order to obtain better heat conduction and dissipation, the thermally conductive member 26 is fixedly attached to the top surface 12*a* of the package body 12 with thermal glue 48, although mechanical or other fasteners or the like may be used as well.

In a preferred embodiment of the present invention where the recess 46 is provided in the top surface 12*a* of the package body 12 to accommodate the thermally conductive member 26, the thermally conductive member 26 comprises melted solder. The melted solder can be any appropriate solder paste, such as tin solder paste. During the solder paste reflow process, the solder paste applied in the recess 46 melts and activators such as fluxes volatilize from the solder paste, then the solder paste solidifies and turns into a metal slug, which then serves as the thermally conductive member 26. The metal slug formed from the solder paste reflow process may be further fixedly attached to a bottom surface of the recess 46 with the thermal glue 48 or other appropriate fasteners. In this manner, readily available and controllable solder paste can be used to produce the thermally conductive member 26, which enables to provide an integral heat sink to the semiconductor device 200 in an easy and inexpensive way.

As shown in FIG. 4, the thermally conductive member 26 has a generally circular shape. However, any other appropriate shapes may be used as well, such as square, as shown schematically by the dashed square in FIG. 4. In addition, the size of the thermally conductive member 26 is not particularly limited. It is preferred that the size of the thermally conductive member 26 is equal to or larger than that of the semiconductor die 16 and thus the thermally conductive member 26 overlies the active surface 16*a* of the semiconductor die 16, which allows for better heat conduction and dissipation. In addition, the thickness of the thermally conductive member 26 is not particularly limited either, and it can be varied as necessary depending on the configurations of the semiconductor die 16, the PCB 14 and the package body 12, or other like factors. As an example, when the thickness of the package body 12 is about 1.4 to 2 mm, the thickness of the thermally conductive member 26 is about 0.4 to 0.5 mm.

Figure 9:
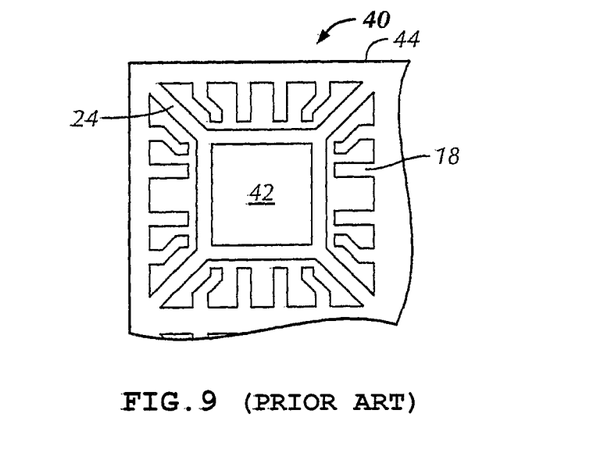
FIG. 9 is a top plan view of a lead frame for assembling a semiconductor device in accordance with an embodiment of the present invention.

FIG. 9 shows a top plan view of an existing lead frame 40 having at least one tie bar 24 for holding the lead frames 40 to a common support 44 during manufacturing process. Conventionally, after individual lead frames are singulated, the tie bar 24 is removed or cut out. However, according to a preferred embodiment of the present invention, the tie bar 24 is retained and applied to the top surface 12*a* of the package body 12 to providing an integral heat sink, giving the semiconductor device 300 additional heat dissipation paths to the top surface 12*a* of the package body 12, and increasing thermal and power dissipation efficiency at a low cost compared to the semiconductor device 100.

Figure 5:
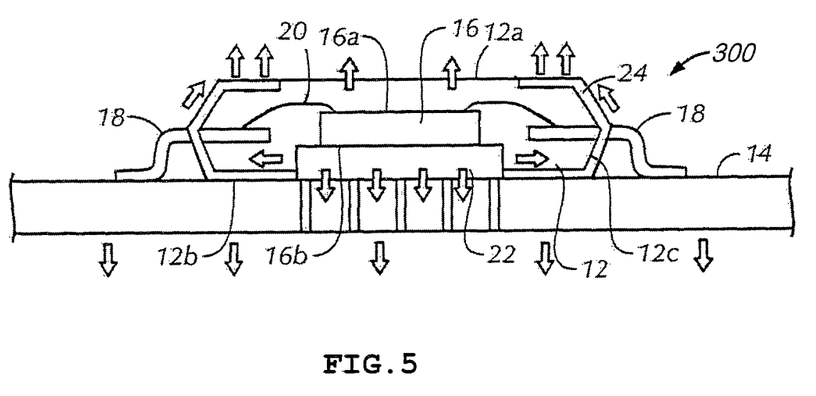
FIG. 5 is a cross-sectional side elevational view of a semiconductor device in accordance with another embodiment of the present invention.
Figure 6:
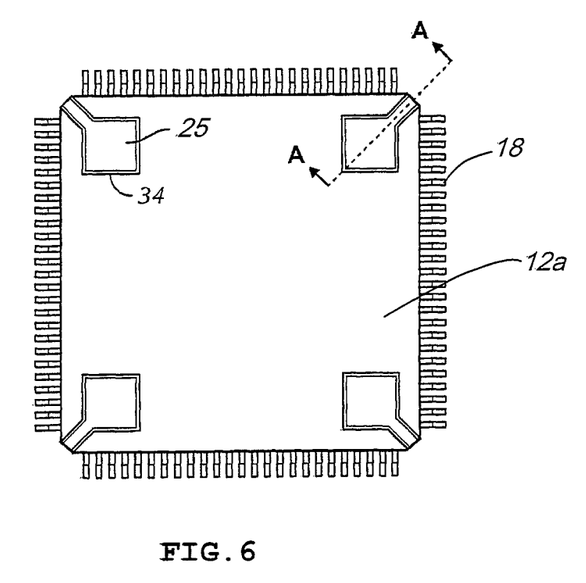
FIG. 6 is a top plan view of the semiconductor device of FIG. 5.

FIGS. 5 and 6 respectively show a cross-sectional side elevational view and a top plan view of the semiconductor device 300. FIG. 5 is taken along the line A-A in FIG. 6; and for clarity, the plurality of leads 18 are also shown in FIG. 5. As shown in FIGS. 5 and 6, at least one tie bar 24 is partially embedded within the package body 12 and has an exposed segment extending from the die flag 22 along the bottom surface 12*b* of the package body 12, up the side surface 12*c* of the package body 12, and onto the top surface of the package body 12, where a portion 25 of the exposed segment of the tie bar 24 is in direct contact with, and preferably fixedly attached to, the top surface 12*a* of the package body 12 preferably with an adhesive such as thermal glue, although mechanical or other fasteners or the like may be used as well. In a preferred embodiment, the portion 25 of the exposed segment is received within a groove 34 formed in the top surface 12*a* of the package body 12 (see FIG. 6), although it is not necessarily limited thereto. Inside the package body 12, the tie bars 24 are connected to the semiconductor die 16, such as by way of the die flag 22.

The tie bar 24 is typically made of the same material as the leads 18, which are preferably made of copper (Cu), aluminium (Al), or other materials with good heat conductance. The tie bar 24 is preferably located in a region of the package body 12 that does not interfere with the conductive leads 18 or the connections to the semiconductor die 16, such as at corners of the side surface 12*c* of the package body 12. In order to obtain better results of heat conduction and dissipation, it is preferable to maximize the exposed surface area of the tie bar 24, and in particular the portion 25 of the exposed segment that is in contact with the top surface 12*a* of the package body 12. As shown in FIG. 6, the portion 25 of the exposed segment of the tie bar 24 is generally square shaped, although other shapes, such as a circular, oval, polygonal or the like may be used as well.

Figure 7:
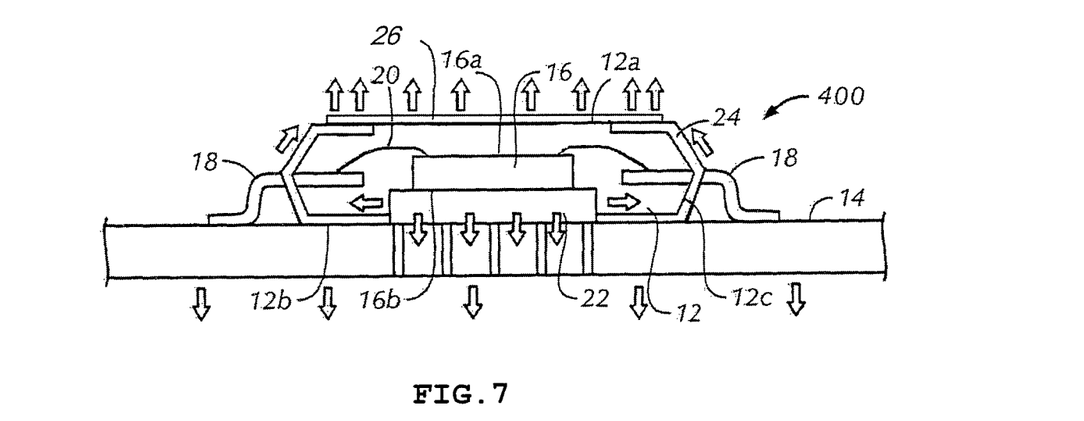
FIG. 7 is a cross-sectional side elevational view of a semiconductor device in accordance with another embodiment of the present invention.
Figure 8:
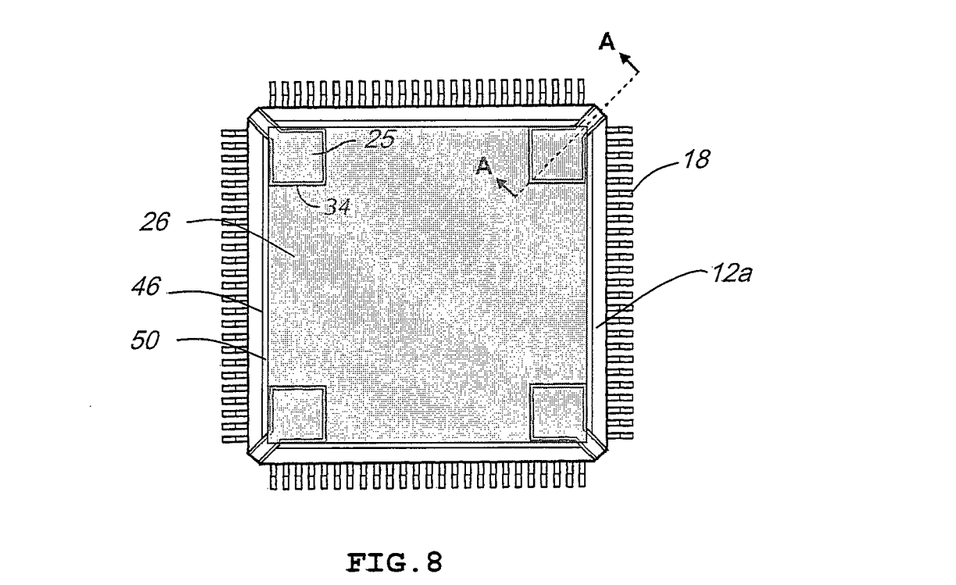
FIG. 8 is a top plan view of the semiconductor device of FIG. 7.

FIGS. 7 and 8 respectively show a cross-sectional side elevational view and a top plan view of the semiconductor device 400. FIG. 7 is taken along the line A-A in FIG. 8; and for clarity, the plurality of leads 18 are also shown in FIG. 7. The semiconductor device 400 is obtained from a combination of the semiconductor device 200 shown in FIGS. 3 and 4, and the semiconductor device 300 shown in FIGS. 5 and 6, and provides an even higher heat dissipation efficiency.

In the semiconductor device 400, in order to obtain better heat conduction and dissipation, the portion 25 of the exposed segment of the tie bar 24 that is in contact with the top surface 12*a* of the package body 12 is received within a groove 34 of the top surface 12*a* of the package body 12 to ensure a flat profile of the structure. In this manner, a thermally conductive member 26 is attached to and in contact with both the top surface 12*a* of the package body 12, more particularly, the middle part thereof, and the portion 25 of the exposed segment of the tie bar 24, which is located at a corner of the top surface 12*a* of the package body 12. As schematically shown by the upward arrows in FIG. 7, additional heat is conducted to the top surface 12*a* of the package body 12 and then dissipated to the environment. The thermally conductive member 26 provides an integral heat sink together with the tie bar 24, greatly increasing the thermal dissipation efficiency of the semiconductor device 400, especially for the top surface 12*a* of the package body 12.

As shown in FIG. 8, according to a preferred embodiment of the present invention, in the semiconductor device 400, instead of being disposed directly on the top surface 12*a* of the package body 12, the thermally conductive member 26 is disposed in a recess 46 of the top surface 12*a* of the package body 12, as in the semiconductor device 200. In such a case, the depth of the groove 34 for accommodating the portion 25 of the exposed segment of each tie bar 24 is larger than that of the recess 46 for accommodating the thermally conductive member 26 so that the top surface of the portion 25 of the exposed segment of the tie bar 24 is level with the bottom surface of the recess 46, thereby the thermally conductive member 26 is in contact with both the top surface 12*a* of the package body 12 and the portion 25 of the exposed segment of the tie bar 24. There is no other particular limit to the depth of the recess 46. The top surface of the thermally conductive member 26 can be lower or higher than the top surface 12*a* of the package body 12 outside the recess 46, or the top surface of the thermally conductive member 26 and the top surface 12*a* of the package body 12 outside the recess 46 are level with each other.

In the semiconductor device 400, the thermally conductive member 26 is preferably made from a material with good heat conductance, as in the semiconductor device 200. For example, the thermally conductive member 26 is a metal member, though it is not necessarily limited thereto.

In a preferred embodiment, in the semiconductor device 400, the thermally conductive member 26 comprises a metal slug, as in the semiconductor device 200. The metal slug is preferably fixedly attached to the portion 25 of the exposed segment of the tie bar 24 with a solder 50, though it is not necessarily limited thereto.

Alternatively, in a preferred embodiment where the recess 46 is provided in the top surface 12*a* of the package body 12 to accommodate the thermally conductive member 26, the thermally conductive member 26 comprises melted solder reflow in the recess 46, as in the semiconductor device 200. In such a case, although the depth of the groove 34 for accommodating the portion 25 of the exposed segment of each tie bar 24 is typically larger than that of the recess 46 for accommodating the thermally conductive member 26, the top surface of the portion 25 of the exposed segment of each tie bar 24 is not necessarily level with the bottom surface of the recess 46. The thermally conductive member 26 is still in contact with both the top surface 12*a* of the package body 12 (in the recess 46) and the portion 25 of the exposed segment of the tie bar 24 due to the flowability of the solder paste. Since the tie bar 24 is typically made of metals such as copper (Cu), aluminium (Al) or the like, the metal slug formed from the solder paste reflow may be fixedly attached to the portion 25 of the exposed segment of the tie bar 24 so as to be integral without any further processing.

Referring to FIG. 8, the top plan view of the semiconductor device 400, the thermally conductive member 26 has a general shape of a square. However, any other appropriate shapes may be used as well. In addition, the size of the thermally conductive member 26 is not particularly limited. It is preferred that the thermally conductive member 26 covers both the active surface 16*a* of the semiconductor die 16 and the top surface of the portion 25 of the exposed segment of each tie bar 24, which ensures better results of heat conduction and dissipation. In addition, the thickness of the thermally conductive member 26 is not particularly limited either, and it is varied as necessary depending on the configurations of the semiconductor die 16, the PCB 14 and the package body 12, or other like factors.

Figure 10A:
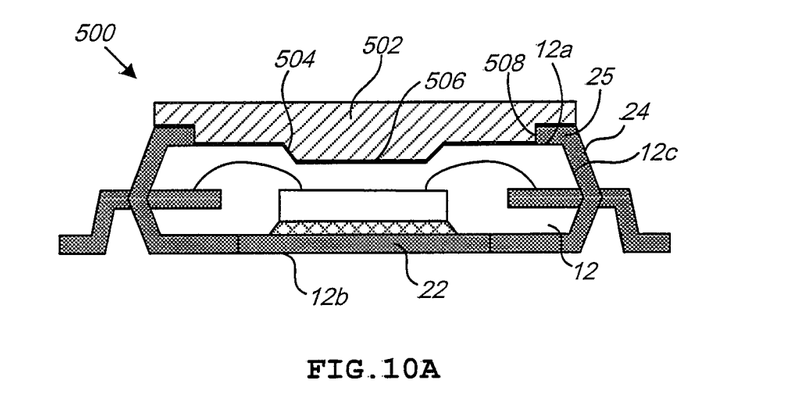
FIGS. 10A and 10B are cross-sectional side elevational views of semiconductor devices in accordance with yet another embodiment of the present invention.

Referring to FIG. 10A, a schematic cross sectional view of a semiconductor device 500 in accordance with an embodiment of the present invention is shown. Similar to the semiconductor device 400 shown in FIG. 7, the tie bar 24 in the semiconductor device 500 has an exposed segment extending from the die flag 22 along the bottom surface 12*b* of the package body 12, up the side surface 12*c* of the package body 12, and onto the top surface 12*a* of the package body 12. The portion 25 of the exposed segment is attached to the top surface 12*a* of the package body 12. A T-shaped thermally conductive member 502 is attached to the top surface 12*a* of the package body 12. The package body 12 has a central cavity 504 within which a base 506 of the T-shaped thermally conductive member 502 is received and attached. In a preferred embodiment, the T-shaped thermally conductive member 502 also has at least one notch 508 formed at an inner end of the "T" section that receive and contact the portion 25 of the tie bar 24.

Figure 10B:
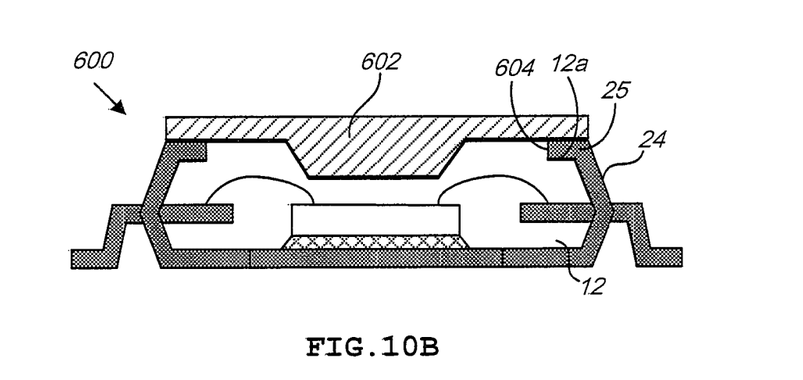

FIG. 10B shows a schematic cross sectional view of a semiconductor device 600 in accordance with another embodiment of the present invention. The semiconductor device 600 is similar to the semiconductor device 500 shown in FIG. 10A except that the notch 604 is formed in the top surface 12*a* of the package body 12 to receive the portion 25 of the tie bar 24 and then the T-shaped thermally conductive member 602 does not need notches to accommodate the tie bar 24.

Figure 11:
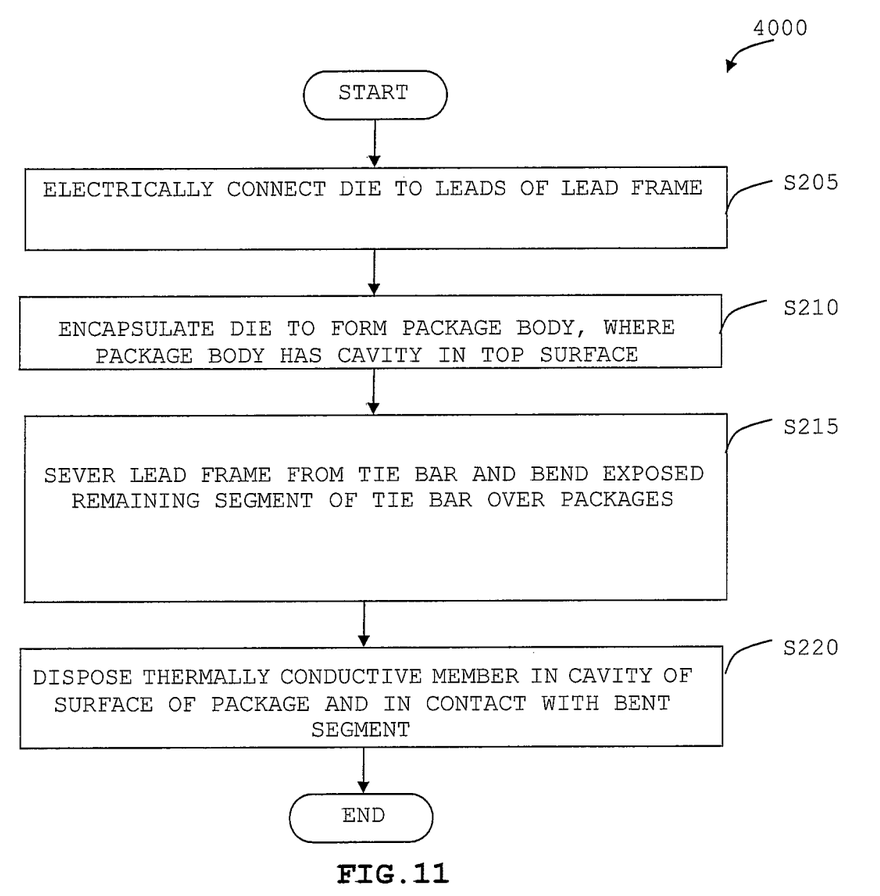
FIG. 11 is an exemplary flowchart of a method of manufacturing the semiconductor device with at least one tie bar in FIG. 7.

FIG. 11 is a flow chart showing the steps of a method 4000 of assembling the semiconductor device 400 with reference to FIGS. 7, 8 and 9. The method 4000 starts at S205 by electrically connecting a semiconductor die 16 to each of a plurality of leads 18 of a lead frame 40 preferably with a bonding wire 20.

At step S210, the semiconductor die 16 is encapsulated in a packaging material to form a package body 12, wherein the package body has a top surface 12*a* and an opposing bottom surface 12*b*, and the semiconductor die 16 has an active surface 16*a* facing the top surface 12*a* of the package body 12 and an opposing bottom surface 16*b* facing the bottom surface 12*b* of the package body 12. A portion of each of the plurality of leads 18 and the bonding wire 20 are also encapsulated in the packaging material to form the package body 12 at the same time. At least one tie bar 24 is partially encapsulated within the package body 12 and has an exposed segment extending outside of the package body 12. In a preferred embodiment, the package body 12 has a recess 46 in the top surface 12*a* of the package body 12. The recess 46 is preferably formed by a mold chase that has a convex portion during the encapsulation process, or is formed at any time following the encapsulation process by etching or the like.

At step S215, the leads 18 and the tie bar 24 are severed from the support 44 of the lead frame 40 preferably by sawing or punching, or other known singulation process. The singulation process also provides the opportunity to shape a portion 25 of the exposed segment of the tie bar 24 as desired. The severing and shaping occurs simultaneously or successively. The exposed segment of the tie bar 24 is bent over the package body 12, wherein the portion 25 of the exposed segment is in contact with the top surface 12*a* of the package body 12. In a preferred embodiment, an adhesive such as thermal glue is applied for fixed attachment prior to or following the bending process. In a preferred embodiment, the portion 25 is received within a groove 34 formed in the top surface 12*a* of the package body 12. Similar to the recess 46, the groove 34 is preferably formed by a mold chase that has a convex portion during the encapsulation process, or is formed at any time following the encapsulation process by etching or the like.

At step S220, a thermally conductive member 26 is disposed on the top surface 12*a* of the package body 12, wherein the thermally conductive member 26 is in contact with the top surface 12*a* of the package body 12 and a top surface of the portion 25 of the exposed segment of the tie bar 24, and spaced from the active surface 16*a* of the semiconductor die 16 by the packaging material. Therefore, the thermally conductive member 26, together with the tie bar 24, forms an integral heat sink to conduct heat generated by the semiconductor die 16, especially from the top surface 12*a* of the package body 12. In a preferred embodiment, the thermally conductive member 26 is disposed and accommodated in the recess 46 of the top surface 12*a* of the package body 12.

In accordance with a preferred embodiment of the present invention, the thermally conductive member 26 comprises a metal slug disposed directly on the top surface 12*a* of the package body 12 or disposed in the recess 46 of the top surface 12*a* of the package body 12. Solder 50 is preferably applied for fixedly attaching the metal slug to the portion 25 of the exposed segment of each tie bar 24. In another preferred embodiment, the thermally conductive member 26 comprises melted solder and disposing the thermally conductive member 26 within the recess 46 comprises reflowing the solder.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps than those listed in a claim. Further, the term "a" or "an", as used herein, is defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

What is claimed is:

1. A semiconductor device, comprising:
   a package body having a top main surface and an opposing, bottom mounting surface;
   a semiconductor die encapsulated in the package body and having an active surface facing the top main surface of the package body and an opposing bottom surface facing the bottom mounting surface of the package body; and
   a heat spreader disposed within a recess in the top main surface of the package body and spaced from the active surface of the semiconductor die by a portion of the package body, wherein the heat spreader conducts heat generated by the semiconductor die;
   a die flag having a top surface and a bottom surface, wherein the bottom surface of the semiconductor die is attached to the top surface of the die flag and the bottom surface of the die flag is exposed at the bottom mounting surface of the package body; and
   a plurality of leads that surround the semiconductor die and the die flag, wherein the semiconductor die is electrically coupled to the plurality of leads and wherein at least a portion of each of the leads is exposed at least one of a side surface and the bottom mounting surface of the package body;
   a tie bar that extends from the die flag along the bottom mounting surface of the package body, up the side surface of the package body, and onto the top main surface of the package body.

2. The semiconductor device of claim 1, wherein the heat spreader comprises solder.

3. The semiconductor device of claim 1, wherein the heat spreader is fixedly attached to the top main surface of the package body with thermal glue.

4. The semiconductor device of claim 1, wherein the leads project from the side surface of the package body.

5. The semiconductor device of claim 1, wherein the tie bar is in contact with the heat spreader.

6. A semiconductor device, comprising:
   a package body having a top surface and an opposing bottom surface;
   a semiconductor die encapsulated in the package body and having an active surface facing the top surface of the package body and an opposing, bottom surface facing the bottom surface of the package body;
   at least one tie bar partially embedded within the package body and having an exposed segment extending outside of the package body, wherein a portion of the exposed segment is received within a groove formed in the top surface of the package body and is in contact with the top surface of the package body; and
   a heat spreader in contact with the top surface of the package body and the portion of the exposed segment of the tie bar.

7. The semiconductor device of claim 6, wherein the heat spreader is disposed within a recess formed in the top surface of the package body.

8. The semiconductor device of claim 7, wherein the heat spreader comprises solder.

9. The semiconductor device of claim 7, wherein the heat spreader comprises a metal slug.

10. The semiconductor device of claim 9, wherein the metal slug is T-shaped.

11. The semiconductor device of claim 6, wherein the heat spreader is fixedly attached to the portion of the exposed segment of the tie bar with solder.

12. The semiconductor device of claim 6, further comprising:
    a die flag having a top surface and a bottom surface, wherein the bottom surface of the semiconductor die is attached to the top surface of the die flag and the bottom surface of the die flag is exposed at the bottom surface of the package body; and
    a plurality of leads that surround the semiconductor die and the die flag, wherein the semiconductor die is electrically coupled to the plurality of leads and wherein at least a portion of each of the leads is exposed at least one of a side surface and the bottom surface of the package body.

* * * * *